(12) United States Patent
Do et al.

(10) Patent No.: US 9,147,662 B1
(45) Date of Patent: Sep. 29, 2015

(54) INTEGRATED CIRCUIT PACKAGING SYSTEM WITH FIBER-LESS SUBSTRATE AND METHOD OF MANUFACTURE THEREOF

(71) Applicants: Byung Tai Do, Singapore (SG); Arnel Senosa Trasporto, Singapore (SG); Sung Soo Kim, Seoul (KR)

(72) Inventors: Byung Tai Do, Singapore (SG); Arnel Senosa Trasporto, Singapore (SG); Sung Soo Kim, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 14/137,755

(22) Filed: Dec. 20, 2013

(51) Int. Cl.
*H01L 23/492* (2006.01)
*H01L 23/00* (2006.01)

(52) U.S. Cl.
CPC .............. *H01L 24/18* (2013.01); *H01L 24/14* (2013.01); *H01L 24/82* (2013.01)

(58) Field of Classification Search
CPC .................................................. H01L 21/4857
USPC ........... 257/684, 692, 777; 438/455, 666, 677
See application file for complete search history.

(56) References Cited

U.S. PATENT DOCUMENTS

| | | | |
|---|---|---|---|
| 4,434,544 A * | 3/1984 | Dohya et al. ..................... 216/13 |
| 5,350,886 A * | 9/1994 | Miyazaki et al. ............. 174/250 |
| 6,423,571 B2 * | 7/2002 | Ogino et al. .................. 438/106 |
| 7,268,012 B2 | 9/2007 | Jiang et al. |
| 7,342,318 B2 | 3/2008 | Huang et al. |
| 7,423,340 B2 | 9/2008 | Huang et al. |
| 7,638,879 B2 | 12/2009 | Jiang et al. |
| 7,906,850 B2 | 3/2011 | Wang et al. |
| 7,939,383 B2 | 5/2011 | Huang et al. |
| 8,138,022 B2 * | 3/2012 | Sugiyama et al. ............ 438/109 |
| 8,389,663 B2 | 3/2013 | Brock et al. |
| 8,416,577 B2 | 4/2013 | Wang et al. |
| 8,826,526 B2 * | 9/2014 | Maeda ............................ 29/831 |
| 2005/0140019 A1 * | 6/2005 | Watanabe ...................... 257/774 |
| 2006/0073701 A1 * | 4/2006 | Koizumi et al. ............. 438/666 |
| 2009/0140442 A1 | 6/2009 | Lin |
| 2012/0248624 A1 * | 10/2012 | Endo ............................ 257/774 |
| 2013/0069241 A1 | 3/2013 | Lin et al. |

* cited by examiner

*Primary Examiner* — George Fourson, III
(74) *Attorney, Agent, or Firm* — Ishimaru & Associates LLP

(57) ABSTRACT

An integrated circuit packaging system including: a fiber-less organic substrate including: a first dielectric layer, a first metal layer on the first dielectric layer, a second dielectric layer on the first dielectric layer and the first metal layer, and an interconnect via plated on the first metal layer and the second dielectric layer; an integrated circuit mounted over the second dielectric layer; and an integrated circuit interconnect between the integrated circuit and the interconnect via.

20 Claims, 6 Drawing Sheets

INTEGRATED CIRCUIT PACKAGING SYSTEM WITH FIBER-LESS SUBSTRATE AND METHOD OF MANUFACTURE THEREOF

TECHNICAL FIELD

The present invention relates generally to an integrated circuit packaging system, and more particularly to a system for integrated circuit package with fiber-less substrate.

BACKGROUND ART

Integrated circuit devices have pervaded virtually all aspects of modern life. From cell phones to equipment for manufacturing airplanes, integrated circuit devices improve processes and machines that are often take for granted. The demands for electronic devices with integrated circuits increasingly require more functions with faster response in reduced dimensions and at lower prices. These high performance devices often demand all of lighter, faster, smaller, multi-functional, highly reliable, and lower cost.

In efforts to meet such requirements, improvements have been attempted in many aspects of electronic product development such as producing smaller and less expensive semiconductor chips. Unfortunately, this development is still not enough to satisfy the demands. Every aspect including packaging can contribute.

A commonly used integrated circuit or semiconductor device methodology for packaging uses a substrate for the semiconductor chips. The substrate or "board" provides a connection pattern of input and output elements such as contacts, leads, or other electrodes connecting the integrated circuit. Numerous technologies have been developed to meet these requirements. Some research and development focused on new package technologies while others focused on improving existing and mature package technologies. Research and development in package technologies may include a seemingly endless number of different approaches.

One proven way to reduce cost is to use package technologies with existing manufacturing methods and equipment. Paradoxically, the reuse of existing manufacturing processes does not typically result in the reduction of package size. Existing packaging technologies struggle to cost effectively meet demands of today's integrated circuit packages.

Of course, the requirement of additional material including the substrate undesirably increases the thickness and cost of fabricating the package. Moreover, the use of an additional substrate material may undesirably increase the manufacturing cycle time, which can also increase cost. Despite the advantages of recent developments in semiconductor fabrication and packaging techniques, there is a continuing need for improving electronic device size, performance, reliability, and manufacturing.

Thus, a need still remains for an integrated circuit packaging system with fiber-less substrate. In view of the increasing demand for low cost and reliable packages, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a support carrier having a metal barrier; depositing a first dielectric layer on the metal barrier; forming a first metal layer on the first dielectric layer and the metal barrier; depositing a second dielectric layer on the first dielectric layer and the first metal layer; plating an interconnect via on the first metal layer and the second dielectric layer; mounting an integrated circuit over the second dielectric layer; and attaching an integrated circuit interconnect between the integrated circuit and the interconnect via.

The present invention provides an integrated circuit packaging system, including: a fiber-less organic substrate including: a first dielectric layer, a first metal layer on the first dielectric layer, a second dielectric layer on the first dielectric layer and the first metal layer, and an interconnect via plated on the first metal layer and the second dielectric layer; an integrated circuit mounted over the second dielectric layer; and an integrated circuit interconnect between the integrated circuit and the interconnect via.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
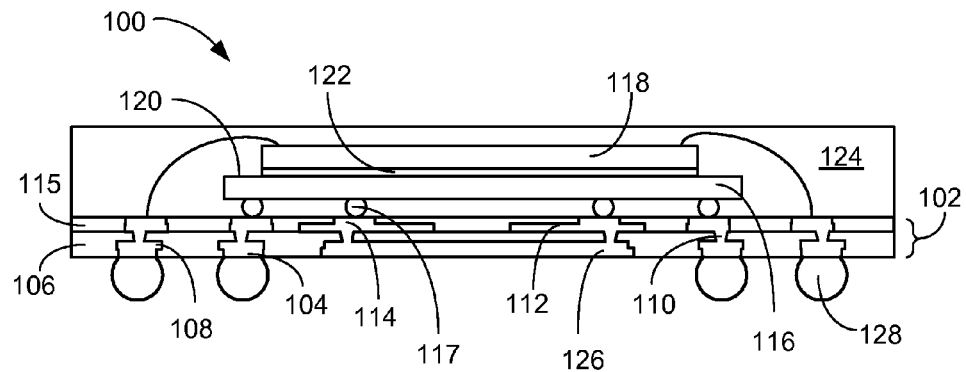
FIG. 1 is a cross-sectional view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the active side of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements with no intervening elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in a first embodiment of the present invention. The cross-sectional view of the integrated circuit package system 100 depicts a fiber-less organic substrate 102 having system contacts 104 embedded in a multi-dielectric layer 106. A first metal layer 108 can provide a structural base for the system contacts 104.

Interconnect vias 110 can electrically and physically connect the first metal layer 108 to a second metal layer 112. The combination of the first metal layer 108 and the second metal layer 112 can provide signal routing and voltage distribution for the integrated circuit package system 100. The physical dimensions of the first metal layer 108 and the second metal layer 112 can be customized without regard to their relative physical dimensions.

Integrated circuit contacts 114 can be formed on the second metal layer 112. A solder resist layer 115 can be formed on the multi-dielectric layer 106 to enclose the second metal layer 112 and leave only a top portion of the integrated circuit contacts 114 exposed for further connection.

The integrated circuit contacts 114 can provide an electrical connection point for a first integrated circuit die 116, such as a flip-chip die, through chip interconnects 117. The chip interconnects 117 can physically mount and electrically connect the first integrated circuit die 116 to the fiber-less organic substrate 102. A second integrated circuit die 118, such as a wire bond die, can be mounted on a backside surface 120 of the first integrated circuit die 116 by an adhesive 122. The second integrated circuit die 118 can be electrically coupled to the fiber-less organic substrate 102 through the chip interconnects 117, such as bond wires.

An epoxy molding compound (EMC) can form a package body 124 to completely enclose the first integrated circuit die 116, the second integrated circuit die 118, the chip interconnects 117, and the integrated circuit contacts 114. The package body 124 can cover the top surface of the fiber-less organic substrate 102, while leaving the sides exposed and bottom exposed. The bottom of the fiber-less organic substrate 102 can include an exposed pad 126 formed of the system contacts 104 and the first metal layer 108. The exposed pad 126 can be used for heat removal, voltage distribution, or a combination thereof. System interconnects 128, such as solder balls, solder bumps, stud bumps, or solder columns, can be coupled to the system contacts 104 distributed around the exposed pad 126.

It has been discovered that the fiber-less organic substrate 102 can provide a very thin and reliable structure for the integrated circuit package system 100. By customizing the size of the first metal layer 108 and the second metal layer 112, the fiber-less organic substrate 102 can provide impedance matching, signal distribution, thermal balancing, and customizable routing, while maintaining a very thin structure.

Thus, it has been discovered that the integrated circuit packaging system and device or product of the present invention furnishes important and heretofore unknown and unavailable solutions, capabilities, and functional aspects for providing technically advanced integrated circuit packages by meeting the electrical, impedance, and thermal needs of the first integrated circuit die 116, the second integrated circuit die 118, or the combination thereof. Because the first metal layer 108 and the second metal layer 112 can be routed and sized independently for each electrical trace in the fiber-less organic substrate 102, a wide range of integrated circuit chips can be combined without concern of voltage distribution problems or heat management problems.

Figure 2:
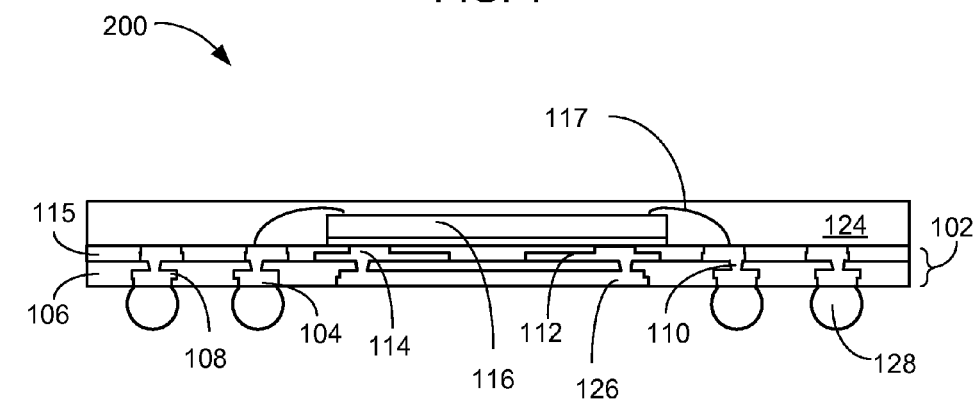
FIG. 2 is a cross-sectional view of an integrated circuit package system in a second embodiment of the present invention.

Referring now to FIG. 2 therein is shown a cross-sectional view of an integrated circuit package system 200 in a second embodiment of the present invention. The cross-sectional view of the integrated circuit package system 200 depicts the fiber-less organic substrate 102 having the system contacts 104 embedded in the multi-dielectric layer 106. The first metal layer 108 can provide a structural base for the system contacts 104.

The interconnect vias 110 can electrically and physically connect the first metal layer 108 to the second metal layer 112. The combination of the first metal layer 108 and the second metal layer 112 can provide signal routing and voltage distribution for the integrated circuit package system 100. The physical dimensions of the first metal layer 108 and the second metal layer 112 can be customized without regard to their relative physical dimensions.

The integrated circuit contacts 114 can be formed on the second metal layer 112. The solder resist layer 115 can be formed on the multi-dielectric layer 106 to enclose the second metal layer 112 and leave only a top portion of the integrated circuit contacts 114 exposed for further connection.

The integrated circuit contacts 114 can provide an electrical connection point for the first integrated circuit die 116, such as a wire bond die, through chip interconnects 117, such as bond wires. The chip interconnects 117 can electrically connect the first integrated circuit die 116 to the fiber-less organic substrate 102.

The epoxy molding compound (EMC) can form the package body 124 to completely enclose the first integrated circuit die 116, the chip interconnects 117, and the integrated circuit contacts 114. The package body 124 can cover the top surface of the fiber-less organic substrate 102, while leaving the sides exposed and bottom exposed. The bottom of the fiber-less organic substrate 102 can include the exposed pad 126 formed of the system contacts 104 and the first metal layer 108. The exposed pad 126 can be used for heat removal, voltage distribution, or a combination thereof. The system interconnects 128, such as solder balls, solder bumps, stud bumps, or solder columns, can be coupled to the system contacts 104 distributed around the exposed pad 126.

It has been discovered that the fiber-less organic substrate 102 can provide a very thin and reliable structure for the integrated circuit package system 200. By customizing the size of the first metal layer 108 and the second metal layer 112, the fiber-less organic substrate 102 can provide impedance matching, signal distribution, thermal balancing, and customizable routing, while maintaining a very thin structure.

Thus, it has been discovered that the integrated circuit packaging system and device or product of the present invention furnishes important and heretofore unknown and unavailable solutions, capabilities, and functional aspects for providing technically advanced integrated circuit packages by meeting the electrical, impedance, and thermal needs of the first integrated circuit die 116. Because the first metal layer 108 and the second metal layer 112 can be routed and sized independently for each electrical trace in the fiber-less organic substrate 102, a wide range of integrated circuit chips can be combined without concern of voltage distribution problems or heat management problems.

Figure 3:
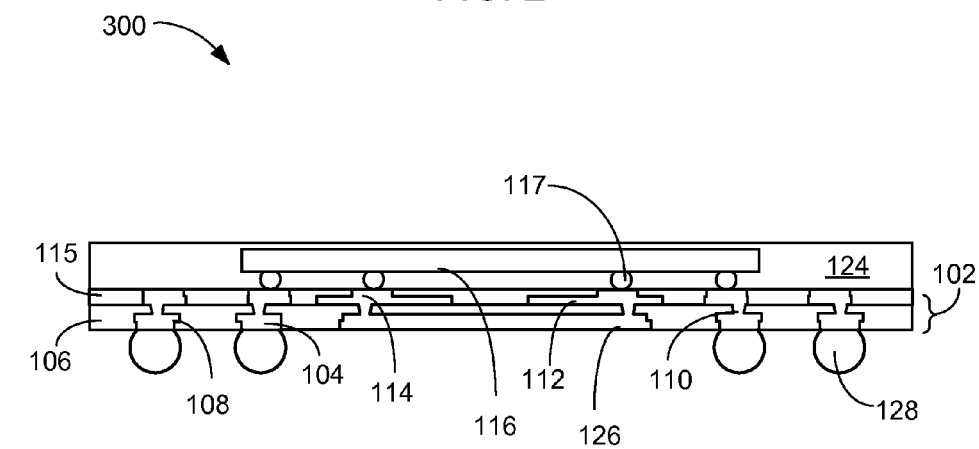
FIG. 3 is a cross-sectional view of an integrated circuit package system in a third embodiment of the present invention.

Referring now to FIG. 3, therein is shown a cross-sectional view of an integrated circuit package system 300 in a third embodiment of the present invention. The cross-sectional view of the integrated circuit package system 300 depicts the fiber-less organic substrate 102 having the system contacts 104 embedded in the multi-dielectric layer 106. The first metal layer 108 can provide a structural base for the system contacts 104.

The interconnect vias 110 can electrically and physically connect the first metal layer 108 to the second metal layer 112. The combination of the first metal layer 108 and the second metal layer 112 can provide signal routing and voltage distribution for the integrated circuit package system 100. The physical dimensions of the first metal layer 108 and the second metal layer 112 can be customized without regard to their relative physical dimensions.

The integrated circuit contacts 114 can be formed on the second metal layer 112. The solder resist layer 115 can be formed on the multi-dielectric layer 106 to enclose the second metal layer 112 and leave only a top portion of the integrated circuit contacts 114 exposed for further connection.

The integrated circuit contacts 114 can provide an electrical connection point for the first integrated circuit die 116, such as a wire bond die, through chip interconnects 117, such as bond wires. The chip interconnects 117 can physically mount and electrically connect the first integrated circuit die 116 to the fiber-less organic substrate 102.

The epoxy molding compound (EMC) can form the package body 124 to completely enclose the first integrated circuit die 116, the chip interconnects 117, and the integrated circuit contacts 114. The package body 124 can cover the top surface of the fiber-less organic substrate 102, while leaving the sides exposed and bottom exposed. The bottom of the fiber-less organic substrate 102 can include the exposed pad 126 formed of the system contacts 104 and the first metal layer 108. The exposed pad 126 can be used for heat removal, voltage distribution, or a combination thereof. The system interconnects 128, such as solder balls, solder bumps, stud bumps, or solder columns, can be coupled to the system contacts 104 distributed around the exposed pad 126.

It has been discovered that the fiber-less organic substrate 102 can provide a very thin and reliable structure for the integrated circuit package system 300. By customizing the size of the first metal layer 108 and the second metal layer 112, the fiber-less organic substrate 102 can provide impedance matching, signal distribution, thermal balancing, and customizable routing, while maintaining a very thin structure.

Thus, it has been discovered that the integrated circuit packaging system and device or product of the present invention furnishes important and heretofore unknown and unavailable solutions, capabilities, and functional aspects for providing technically advanced integrated circuit packages by meeting the electrical, impedance, and thermal needs of the first integrated circuit die 116. Because the first metal layer 108 and the second metal layer 112 can be routed and sized independently for each electrical trace in the fiber-less organic substrate 102, a wide range of integrated circuit chips can be combined without concern of voltage distribution problems or heat management problems.

Figure 4:
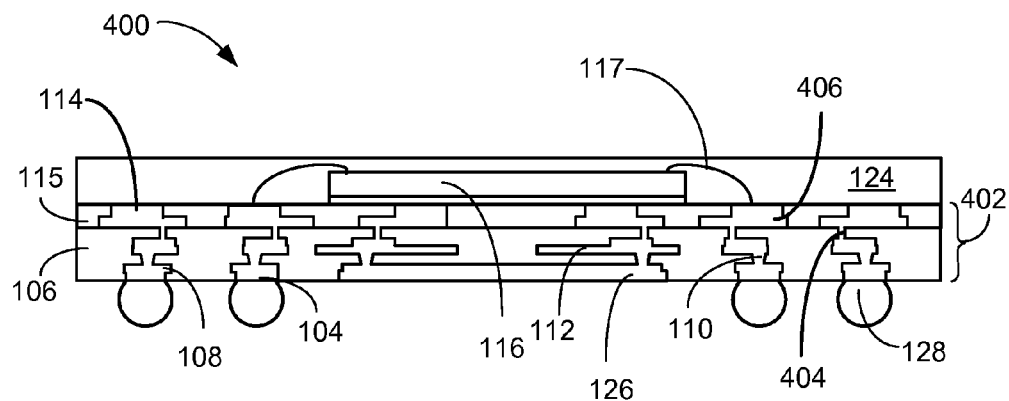
FIG. 4 is a cross-sectional view of an integrated circuit package system in a fourth embodiment of the present invention.

Referring now to FIG. 4, therein is shown a cross-sectional view of an integrated circuit package system 400 in a fourth embodiment of the present invention. The cross-sectional view of the integrated circuit package system 400 depicts the fiber-less organic substrate 402 having the system contacts 104 embedded in the multi-dielectric layer 106. The first metal layer 108 can provide a structural base for the system contacts 104.

The interconnect vias 110 can electrically and physically connect the first metal layer 108 to the second metal layer 112. The combination of the first metal layer 108 and the second metal layer 112 can provide signal routing and voltage distribution for the integrated circuit package system 400. The physical dimensions of the first metal layer 108 and the second metal layer 112 can be customized without regard to their relative physical dimensions.

Second level vias 404 can physically couple and electrically connect the second metal layer 112 and a third metal layer 406. The third metal layer 406 can be formed on the multi-dielectric layer 106, which completely encloses the second metal layer 112 and the sides of the second level vias 404. An integrated circuit contact 114 can be formed on the third metal layer 406. The solder resist layer 115 can be formed on the multi-dielectric layer 106 to enclose the second metal layer 112 and leave only a top portion of the integrated circuit contacts 114 exposed for further connection.

The integrated circuit contacts 114 can provide an electrical connection point for the first integrated circuit die 116, such as a wire bond die, through chip interconnects 117, such as bond wires. The chip interconnects 117 can electrically connect the first integrated circuit die 116 to the fiber-less organic substrate 402.

The epoxy molding compound (EMC) can form the package body 124 to completely enclose the first integrated circuit die 116, the chip interconnects 117, and the integrated circuit contacts 114. The package body 124 can cover the top surface of the fiber-less organic substrate 402, while leaving the sides exposed and bottom exposed. The bottom of the fiber-less organic substrate 402 can include the exposed pad 126 formed of the system contacts 104 and the first metal layer 108. The exposed pad 126 can be used for heat removal, voltage distribution, or a combination thereof. The system interconnects 128, such as solder balls, solder bumps, stud bumps, or solder columns, can be coupled to the system contacts 104 distributed around the exposed pad 126.

It has been discovered that the fiber-less organic substrate 402 can provide a very thin and reliable structure for the integrated circuit package system 400. By customizing the size of the first metal layer 108, the second metal layer 112, and the third metal layer 406, the fiber-less organic substrate 402 can provide impedance matching, signal distribution, thermal balancing, and customizable routing, while maintaining a very thin structure.

Thus, it has been discovered that the integrated circuit packaging system and device or product of the present invention furnishes important and heretofore unknown and unavailable solutions, capabilities, and functional aspects for providing technically advanced integrated circuit packages by meeting the electrical, impedance, and thermal needs of the first integrated circuit die 116. Because the first metal layer 108 and the second metal layer 112 can be routed and sized independently for each electrical trace in the fiber-less organic substrate 402, a wide range of integrated circuit chips can be combined without concern of voltage distribution problems or heat management problems.

Figure 5:
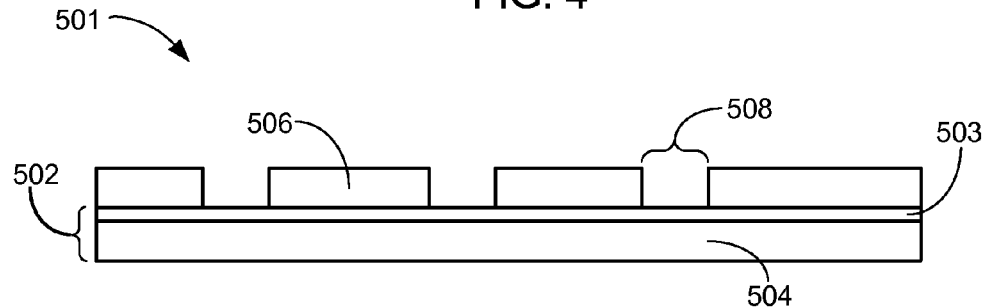
FIG. 5 is a cross-sectional view of a fiber-less organic substrate assembly in a first dielectric phase of manufacturing.

Referring now to FIG. 5, therein is shown a cross-sectional view of a fiber-less organic substrate assembly 501 in a first dielectric phase of manufacturing. The cross-sectional view of the fiber-less organic substrate assembly 501 depicts a support carrier 502 having a metal barrier 503, such as a planar sheet of metal, on and physically attached to a carrier 504, such as an organic or inorganic carrier for supporting the metal barrier 503.

A first layer dielectric 506, such as a photo sensitive dielectric, can be formed on the metal barrier 503 by deposition, lamination, printing, or film attach. The first layer dielectric 506 can be processed by mask and etch, photo sensitive exposure, or laser processing to provide contact openings 508. It is understood that the first layer dielectric 506 can be applied on the metal barrier 503, which could be formed on both sides of the carrier 504. The metal barrier 503 is shown on one side of the carrier 504 by way of an example without limiting the invention.

Figure 6:
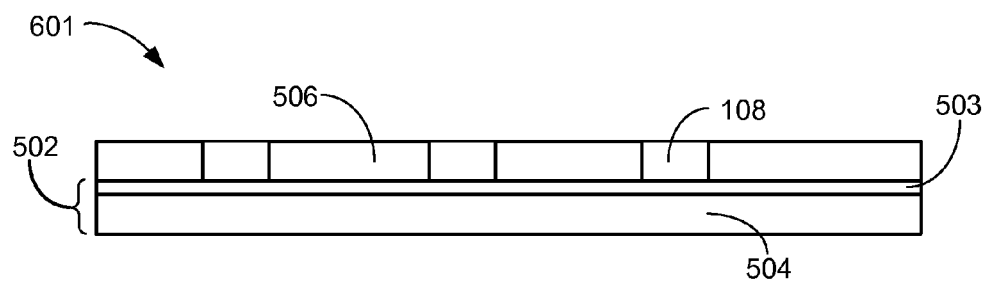
FIG. 6 is a cross-sectional view of the fiber-less organic substrate assembly in a first metal layer deposition phase of manufacturing.

Referring now to FIG. 6, therein is shown a cross-sectional view of the fiber-less organic substrate assembly 601 in a first metal layer deposition phase of manufacturing. The cross-sectional view of the fiber-less organic substrate assembly 601 depicts the support carrier 502 having the metal barrier 503 on and physically attached to the carrier 504. First metal layer 108 can be formed by deposition or plating of a metal, such as copper, gold, or silver in the contact openings 508 of FIG. 5 to fill the first layer dielectric 506.

Figure 7:
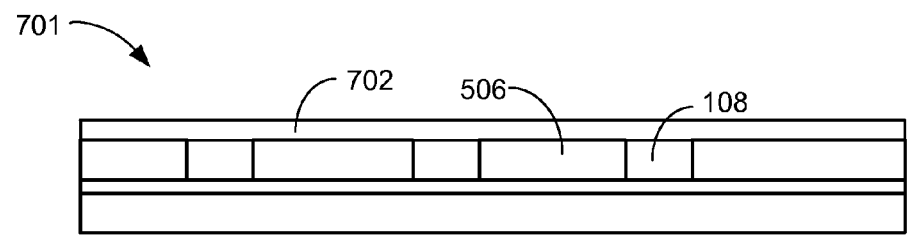
FIG. 7 is a cross-sectional view of the fiber-less organic substrate assembly in a second layer dielectric deposition phase of manufacturing.

Referring now to FIG. 7, there in is shown a cross-sectional view of the fiber-less organic substrate assembly 701 in a second layer dielectric deposition phase of manufacturing. The cross-sectional view of the fiber-less organic substrate assembly 701 depicts a second layer dielectric 702 formed on the first metal layer 108 and the first layer dielectric 506.

Figure 8:
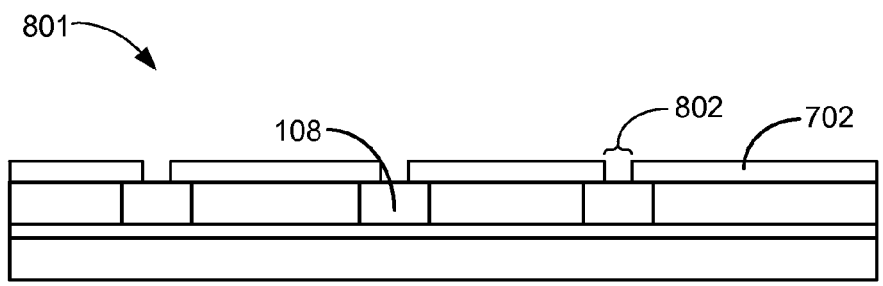
FIG. 8 is a cross-sectional view of the fiber-less organic substrate assembly in a via opening phase of manufacturing.

Referring now to FIG. 8, therein is shown a cross-sectional view of the fiber-less organic substrate assembly 801 in a via opening phase of manufacturing. The cross-sectional view of the fiber-less organic substrate assembly 801 depicts via openings 802 formed in the second layer dielectric 702. The via openings 802 can be positioned over the first metal layer 108 to expose the surface of the first metal layer 108 through the via opening 802. It is understood that the diameter of the via openings 802 can be controlled in order to determine the impedance of the signal path that will be formed through the first metal layer 108.

Figure 9:
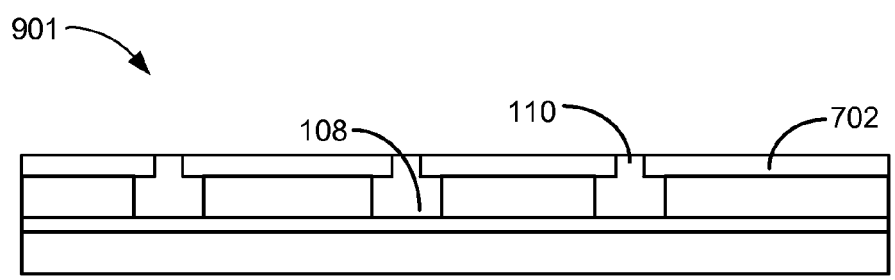
FIG. 9 is a cross-sectional view of the fiber-less organic substrate assembly in a first via metal layer deposition phase of manufacturing.

Referring now to FIG. 9, therein is shown a cross-sectional view of the fiber-less organic substrate assembly 901 in a first via metal layer deposition phase of manufacturing. The cross-sectional view of the fiber-less organic substrate assembly 901 depicts interconnect vias 110 formed in the via openings 802 of FIG. 8. The interconnect vias 110 can be formed by deposition or plating of a metal, such as copper, gold, or silver in the via openings 802 to physically and electrically connect on the first metal layer 108.

Figure 10:
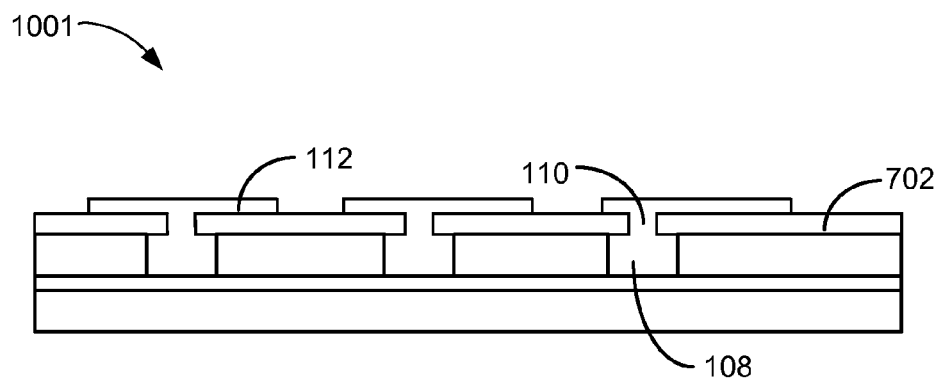
FIG. 10 is a cross-sectional view of the fiber-less organic substrate assembly in a second metal layer deposition phase of manufacturing.

Referring now to FIG. 10, therein is shown a cross-sectional view of the fiber-less organic substrate assembly 1001 in a second metal layer deposition phase of manufacturing. The cross-sectional view of the fiber-less organic substrate assembly 1001 depicts a second metal layer 112 formed on the second layer dielectric 702 and the interconnect vias 110 for forming a physical and electrical connection to the first metal layer 108. The second metal layer 112 can be formed by sputtering, electro-less plating, lamination, or film adhesion. The dimensions of the second metal layer 112 can, be altered by selective plating of copper (Cu), vary across the second layer dielectric 702.

The second metal layer 112 can function as a routing layer between the system interconnects 128 of FIG. 1 and the integrated circuit interconnects 117 of FIG. 1. The relative dimensions of each instance of the first metal layer 108 and the second metal layer 112 can be adjusted to provide an appropriate signal path for the connections to the first integrated circuit 116 of FIG. 1. The traces of the second metal layer 112 can be smaller than, the same size as, or bigger than the first metal layer 108. The routing capabilities of the integrated circuit packaging system 100 of FIG. 1 can be enhanced by the ability to adjust the horizontal and vertical dimensions of the first metal layer 108 and the second metal layer 112 independently on a per signal basis.

The second metal layer 112 can be formed with signal routing (not shown) for completing the interconnections of the first integrated circuit 116. The ability to adjust each of the first metal layer 108 and the second metal layer 112 on an individual signal basis can increase signal quality, thermal flow, and reliability of the integrated circuit packaging system 100.

Figure 11:
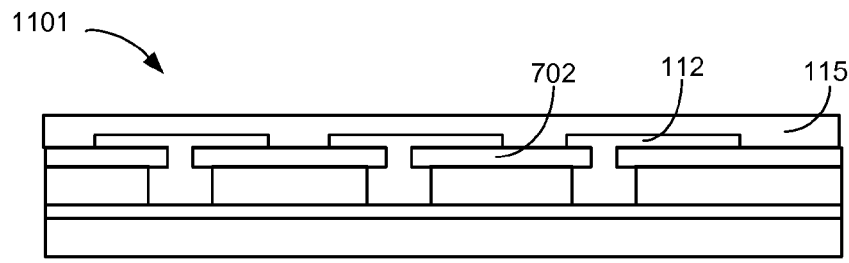
FIG. 11 is a cross-sectional view of the fiber-less organic substrate assembly in a solder resist layer deposition phase of manufacturing.

Referring now to FIG. 11, therein is shown a cross-sectional view of the fiber-less organic substrate assembly 1101 in a solder resist layer deposition phase of manufacturing. The cross-sectional view of the fiber-less organic substrate assembly 1101 depicts the solder resist layer 115 formed on the second metal layer 112 and the second dielectric layer 702.

Figure 12:
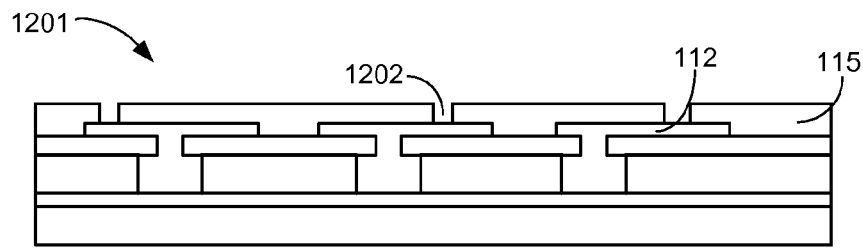
FIG. 12 is a cross-sectional view of the fiber-less organic substrate assembly in a contact opening phase of manufacturing.

Referring now to FIG. 12, therein is shown a cross-sectional view of the fiber-less organic substrate assembly 1201 in a contact opening phase of manufacturing. The cross-sectional view of the fiber-less organic substrate assembly 1201 depicts contact openings 1202 formed in the solder resist layer 115 for exposing the second metal layer 112. The solder resist layer 115 can be a photo sensitive material that can be processed by the processed by exposure to light for forming the contact openings 1202.

Figure 13:
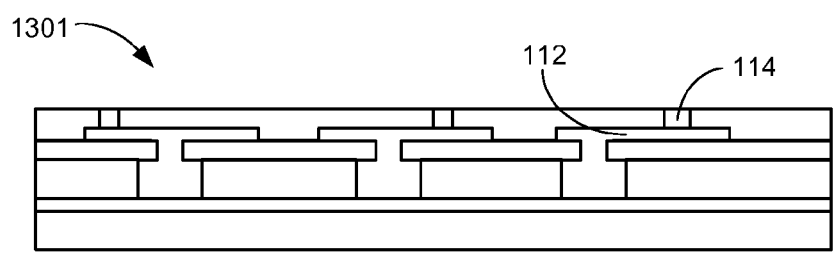
FIG. 13 is a cross-sectional view of the fiber-less organic substrate assembly in a contact deposition phase of manufacturing.

Referring now to FIG. 13, therein is shown a cross-sectional view of the fiber-less organic substrate assembly 1301 in a contact deposition phase of manufacturing. The cross-sectional view of the fiber-less organic substrate assembly 1301 depicts the integrated circuit contacts 114 formed on the second metal layer 112. The integrated circuit contacts 114 can be formed by plating nickel gold (Ni Au) or nickel palladium gold (Ni Pd Au). The integrated circuit contacts 114 can be formed on the second metal layer 112 but can remain recessed within the contact openings 1202 of FIG. 12.

Figure 14:
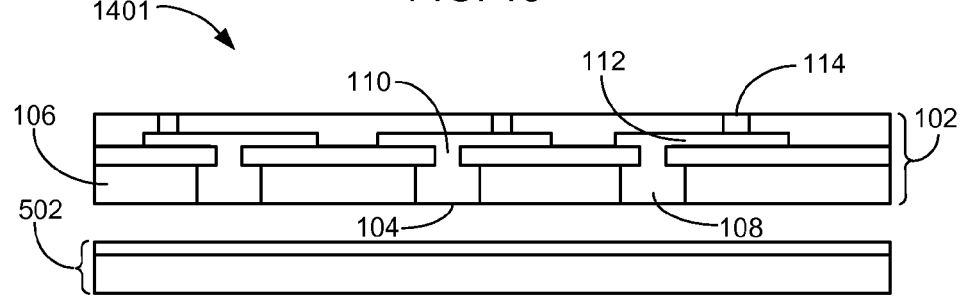
FIG. 14 is a cross-sectional view of the fiber-less organic substrate assembly in a metal coated carrier removal process of manufacturing.

Referring now to FIG. 14, therein is shown a cross-sectional view of the fiber-less organic substrate assembly 1401 in a metal coated carrier removal process of manufacturing. The cross-sectional view of the fiber-less organic substrate assembly 1401 depicts the support carrier 502 having been removed from the fiber-less organic substrate 102.

It has been discovered that the fiber-less organic substrate 102 of the integrated circuit packaging system 100 can provide a low cost, high volume substrate. The lack of mechanical processes for forming the interconnect vias 110 can improve the precision of the routing of the first metal layer 108 and the second metal layer 112 and remove the need for additional drilling and cleaning materials for processing the fiber-less organic substrate 102. The traces of the second metal layer 112 can be smaller than, the same size as, or bigger than the first metal layer 108.

Figure 15:
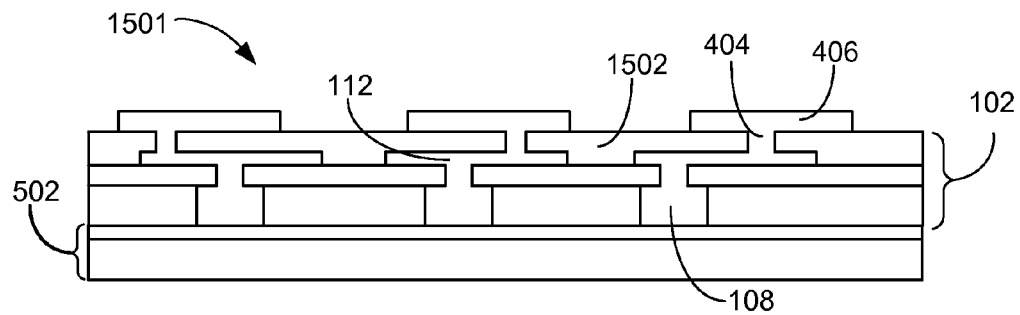
FIG. 15 is a cross-sectional view of the fiber-less organic substrate assembly in a third metal layer deposition phase of manufacturing.

Referring now to FIG. 15, therein is shown a cross-sectional view of the fiber-less organic substrate assembly 1501 in a third metal layer deposition phase of manufacturing. The cross-sectional view of the fiber-less organic substrate assembly 1501 depicts the support carrier 502 with the fiber-less organic substrate 102 formed thereon. A third dielectric layer 1502 is formed on the second metal layer 112 and the second level vias 404. The third metal layer 406 can be formed, by deposition, sputtering, film adhesion, or electro-less plating, on the third dielectric layer 1502 and the second level vias 404.

The dimensions of the third metal layer 406 can be altered by selective plating of copper (Cu) and can vary across the third layer dielectric 1502. The third metal layer 406 can function as a routing layer between the system interconnects 128 of FIG. 4 and the integrated circuit interconnects 117 of FIG. 4. The relative dimensions of each instance of the first metal layer 108, the second metal layer 112, and the third metal layer 406 can be adjusted to provide an appropriate signal path for the connections to the first integrated circuit 116 of FIG. 1.

The routing capabilities of the integrated circuit packaging system 400 of FIG. 4 can be enhanced by the ability to adjust the horizontal and vertical dimensions of the first metal layer 108, the second metal layer 112, and the third metal layer 406 independently on a per signal basis. The third metal layer 406 can have a pattern size smaller, the same as, or bigger than the first metal layer 108 and the second metal layer 112. The ability to adjust each of the first metal layer 108, the second metal layer 112, and the third metal layer 406 on an individual signal basis can increase signal quality, thermal flow, and reliability of the integrated circuit packaging system 400.

Figure 16:
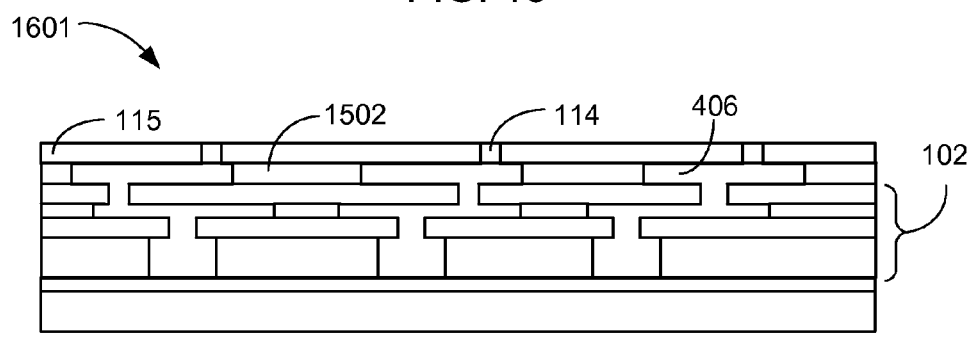
FIG. 16 is a cross-sectional view of the fiber-less organic substrate assembly in a contact deposition phase of manufacturing.

Referring now to FIG. 16, therein is shown a cross-sectional view of the fiber-less organic substrate assembly 1601 in a contact deposition phase of manufacturing. The cross-sectional view of the fiber-less organic substrate assembly 1601 depicts the solder resist layer 115 formed on the third metal layer 406 and the third dielectric layer 1502. The integrated circuit contacts 114 can be formed by plating nickel gold (Ni Au) or nickel palladium gold (Ni Pd Au) through the solder resist layer 115 and on the third metal layer 406. The integrated circuit contacts 114 can be formed on the third metal layer 406 but can remain recessed within the contact openings 1202 of FIG. 12.

Figure 17:
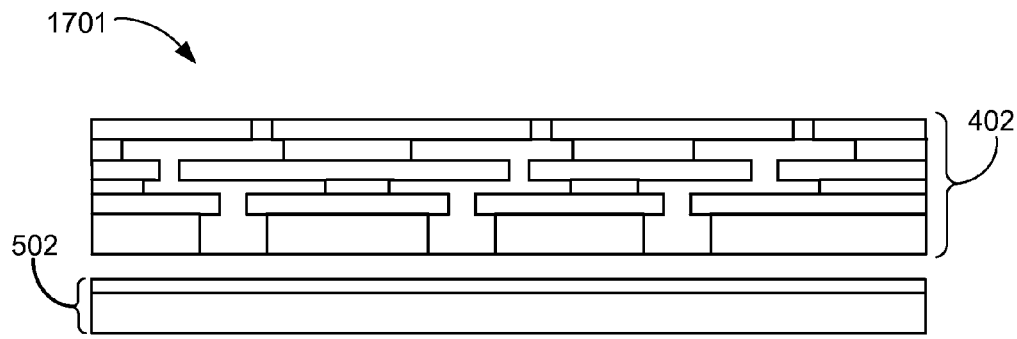
FIG. 17 is a cross-sectional view of the fiber-less organic substrate assembly in a metal coated carrier removal process of manufacturing.

Referring now to FIG. 17, therein is shown a cross-sectional view of the fiber-less organic substrate assembly 1701 in a metal coated carrier removal process of manufacturing. The cross-sectional view of the fiber-less organic substrate assembly 1701 depicts the support carrier 502 having been removed from the fiber-less organic substrate 402. The removal of the support carrier 502 can expose the system contacts 104 from the multi-dielectric layer 106 on the side of the fiber-less organic substrate 102 opposite integrated circuit contacts 114.

It is understood that the support carrier 502 is shown to have only a single processing side but it can differ. An embodiment having a double processing side is envisioned.

Figure 18:
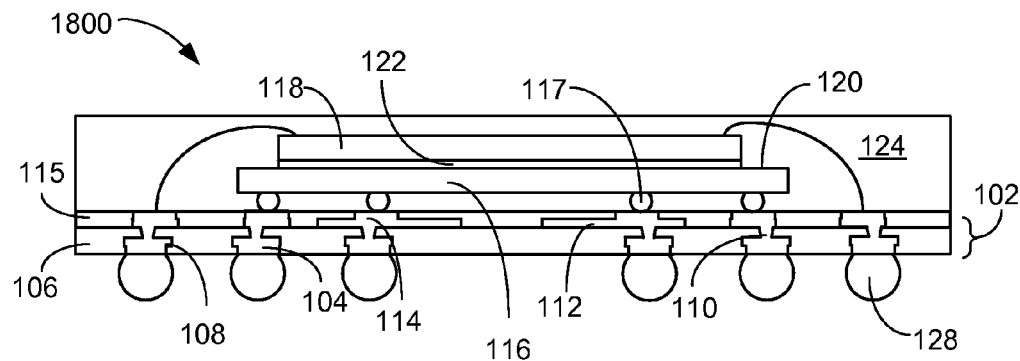
FIG. 18 is a cross-sectional view of an integrated circuit package system in a fifth embodiment of the present invention.

Referring now to FIG. 18, therein is shown a cross-sectional view of an integrated circuit package system 1800 in a fifth embodiment of the present invention. The cross-sectional view of an integrated circuit package system 1800 depicts a fiber-less organic substrate 102 having system contacts 104 embedded in a multi-dielectric layer 106. A first metal layer 108 can provide a structural base for the system contacts 104.

Interconnect vias 110 can electrically and physically connect the first metal layer 108 to a second metal layer 112. The combination of the first metal layer 108 and the second metal layer 112 can provide signal routing and voltage distribution for the integrated circuit package system 100. The physical dimensions of the first metal layer 108 and the second metal layer 112 can be customized without regard to their relative physical dimensions.

Integrated circuit contacts 114 can be formed on the second metal layer 112. A solder resist layer 115 can be formed on the multi-dielectric layer 106 to enclose the second metal layer 112 and leave only a top portion of the integrated circuit contacts 114 exposed for further connection.

The integrated circuit contacts 114 can provide an electrical connection point for a first integrated circuit die 116, such as a flip-chip die, through chip interconnects 117. The chip interconnects 117 can physically mount and electrically connect the first integrated circuit die 116 to the fiber-less organic substrate 102. A second integrated circuit die 118, such as a wire bond die, can be mounted on a backside surface 120 of the first integrated circuit die 116 by an adhesive 122. The second integrated circuit die 118 can be electrically coupled to the fiber-less organic substrate 102 through the chip interconnects 117, such as bond wires.

An epoxy molding compound (EMC) can form a package body 124 to completely enclose the first integrated circuit die 116, the second integrated circuit die 118, the chip interconnects 117, and the integrated circuit contacts 114. The package body 124 can cover the top surface of the fiber-less organic substrate 102, while leaving the sides exposed and bottom exposed. System interconnects 128, such as solder balls, solder bumps, stud bumps, or solder columns, can be coupled to the system contacts 104 distributed across the fiber-less organic substrate 102.

It has been discovered that the fiber-less organic substrate 102 can provide a very thin and reliable structure for the integrated circuit package system 100. By customizing the size of the first metal layer 108 and the second metal layer 112, the fiber-less organic substrate 102 can provide impedance matching, signal distribution, thermal balancing, and customizable routing, while maintaining a very thin structure.

Thus, it has been discovered that the integrated circuit packaging system and device or product of the present invention furnishes important and heretofore unknown and unavailable solutions, capabilities, and functional aspects for providing technically advanced integrated circuit packages by meeting the electrical, impedance, and thermal needs of the first integrated circuit die 116, the second integrated circuit die 118, or the combination thereof. Because the first metal layer 108 and the second metal layer 112 can be routed and sized independently for each electrical trace in the fiber-less organic substrate 102, a wide range of integrated circuit chips can be combined without concern of voltage distribution problems or heat management problems.

Figure 19:
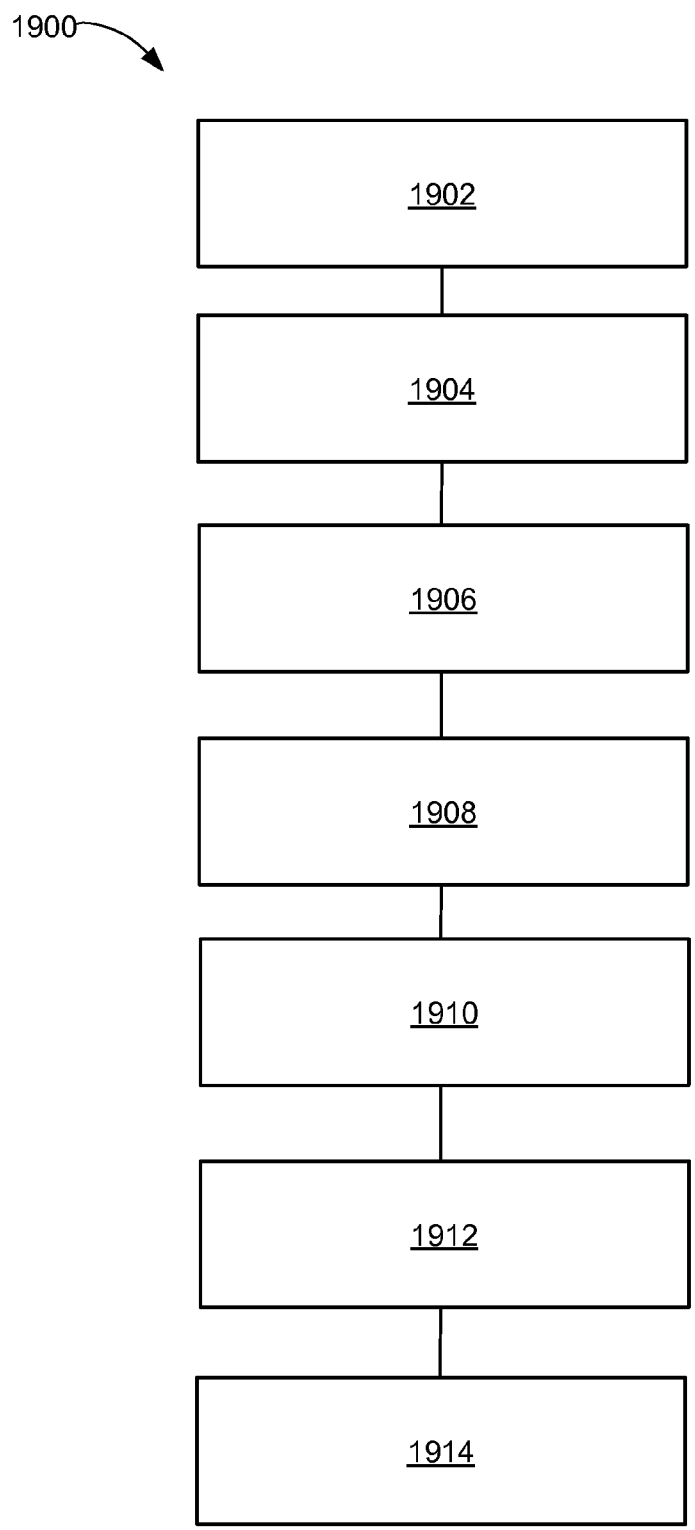
FIG. 19 is a flow chart of a method of manufacture of an integrated circuit packaging system in an embodiment of the present invention.

Referring now to FIG. 19, therein is shown a flow chart of a method 1900 of manufacture of an integrated circuit packaging system in an embodiment of the present invention. The method 1900 includes: providing a support carrier having a metal barrier in a block 1902; depositing a first dielectric layer on the metal barrier of the support carrier in a block 1904; forming a first metal layer on the dielectric layer and the metal barrier in a block 1906; depositing a second dielectric layer on the first dielectric layer and the first metal layer in a block 1908; forming an interconnect via on the first metal layer and the second dielectric layer in a block 1910; mounting an integrated circuit over the second dielectric layer in a block 1912; and attaching an integrated circuit interconnect between the integrated circuit and the interconnect via in a block 1914.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a support carrier having a metal barrier;
   depositing a first dielectric layer on the metal barrier;
   forming a first metal layer on the first dielectric layer and the metal barrier;
   depositing a second dielectric layer on the first dielectric layer and the first metal layer;
   plating an interconnect via on the first metal layer and the second dielectric layer;
   exposing a system contact from the first dielectric layer, opposite the interconnect via by removing the support carrier;
   mounting an integrated circuit over the second dielectric layer; and
   attaching an integrated circuit interconnect between the integrated circuit and the interconnect via.

2. The method as claimed in claim 1 further comprising depositing a second metal layer on the second dielectric layer and the interconnect via includes the second metal layer pattern size smaller, the same as, or bigger than the first metal layer.

3. The method as claimed in claim 1 further comprising:
   depositing a third dielectric layer on the second dielectric layer and a second metal layer;
   forming a second level via on the third dielectric layer and the second metal layer; and
   depositing a third metal layer on the third dielectric layer and the second level via includes the third metal layer having a pattern size smaller, the same as, or bigger than the first metal layer and the second metal layer.

4. The method as claimed in claim 1 further comprising:
   depositing a second metal layer on the second dielectric layer and the interconnect via; and
   depositing an integrated circuit contact on the second metal layer for coupling the integrated circuit interconnect.

5. The method as claimed in claim 1 further comprising:
   coupling a system interconnect on the system contact.

6. A method of manufacture of an integrated circuit packaging system comprising:
   providing a support carrier having a metal barrier on a carrier;
   depositing a first dielectric layer on the metal barrier including forming a contact opening;
   forming a first metal layer, in the contact opening, on the first dielectric layer and the metal barrier;
   depositing a second dielectric layer on the first dielectric layer and the first metal layer including forming a via opening for exposing the first metal layer;
   plating an interconnect via on the first metal layer and the second dielectric layer;
   exposing a system contact from the first dielectric layer, opposite the interconnect via by removing the support carrier;
   mounting an integrated circuit over the second dielectric layer; and
   attaching an integrated circuit interconnect between the integrated circuit and the interconnect via including attaching a solder bump or a bond wire.

7. The method as claimed in claim 6 further comprising depositing a second metal layer on the second dielectric layer and interconnect via including routing a signal path having the second metal layer pattern size smaller, the same as, or bigger than the first metal layer.

8. The method as claimed in claim 6 further comprising:
depositing a third dielectric layer on the second dielectric layer and a second metal layer;
forming a second level via on the third dielectric layer and the second metal layer;
depositing a third metal layer on the third dielectric layer and the second level via including the third metal layer having a pattern size smaller, the same as, or bigger than the first metal layer and the second metal layer; and
depositing an integrated circuit contact on the third metal layer.

9. The method as claimed in claim 6 further comprising:
depositing a second metal layer on the second dielectric layer and the interconnect via; and
depositing an integrated circuit contact on the second metal layer for coupling the integrated circuit interconnect.

10. The method as claimed in claim 6 further comprising:
exposing an external pad from the first dielectric layer by removing the support carrier; and
coupling a system interconnect on the system contact.

11. An integrated circuit packaging system comprising:
a fiber-less organic substrate including:
a first dielectric layer,
a first metal layer on the first dielectric layer,
a second dielectric layer on the first dielectric layer and the first metal layer,
an interconnect via plated on the first metal layer and the second dielectric layer, and
a system contact exposed from the first dielectric layer opposite the interconnect via;
an integrated circuit mounted over the second dielectric layer; and
an integrated circuit interconnect between the integrated circuit and the interconnect via.

12. The system as claimed in claim 11 further comprising a second metal layer deposited on the second dielectric layer and the interconnect via including the second metal layer pattern size smaller, the same as, or bigger than the first metal layer.

13. The system as claimed in claim 11 further comprising:
a second metal layer deposited on the interconnect via;
a second level via on the second metal layer; and
a third metal layer deposited on the second level via including the third metal layer having a pattern size smaller, the same as, or bigger than the first metal layer and the second metal layer.

14. The system as claimed in claim 11 further comprising:
a second metal layer on the second dielectric layer and the interconnect via; and
an integrated circuit contact on the second metal layer for coupling the integrated circuit interconnect.

15. The system as claimed in claim 11 further comprising:
a system interconnect coupled to the system contact.

16. The system as claimed in claim 11 further comprising a solder bump or a bond wire between the integrated circuit and the interconnect via.

17. The system as claimed in claim 16 further comprising a second metal layer on the second dielectric layer and interconnect via including a signal path, routed in the fiber-less organic substrate, having the second metal layer pattern size smaller, the same as, or bigger than the first metal layer.

18. The system as claimed in claim 16 further comprising:
a third dielectric layer deposited on the second dielectric layer and a second metal layer;
a second level via formed on the third dielectric layer and the second metal layer;
a third metal layer deposited on the third dielectric layer and the second level via including the third metal layer having a pattern size smaller, the same as, or bigger than the first metal layer and the second metal layer; and
an integrated circuit contact on the third metal layer.

19. The system as claimed in claim 16 further comprising:
a second metal layer deposited on the second dielectric layer and the interconnect via; and
an integrated circuit contact on the second metal layer for coupling the integrated circuit interconnect.

20. The system as claimed in claim 16 further comprising:
an external pad exposed from the first dielectric layer; and
a system interconnect on the system contact.

* * * * *